US011335618B2

(12) United States Patent
Lambert

(10) Patent No.: US 11,335,618 B2
(45) Date of Patent: May 17, 2022

(54) THERMALS FOR PACKAGES WITH INDUCTORS

(71) Applicant: Intel Corporation, Santa Clara, CA (US)

(72) Inventor: William J. Lambert, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 799 days.

(21) Appl. No.: 16/030,182

(22) Filed: Jul. 9, 2018

(65) Prior Publication Data

US 2020/0013693 A1 Jan. 9, 2020

(51) Int. Cl.
*H01L 23/367* (2006.01)
*H01L 23/00* (2006.01)
*H01L 23/498* (2006.01)
*H01L 23/64* (2006.01)
*H01L 21/48* (2006.01)

(52) U.S. Cl.
CPC ........ *H01L 23/367* (2013.01); *H01L 21/4853* (2013.01); *H01L 21/4857* (2013.01); *H01L 21/4882* (2013.01); *H01L 23/49816* (2013.01); *H01L 23/49822* (2013.01); *H01L 23/49838* (2013.01); *H01L 23/645* (2013.01); *H01L 24/16* (2013.01); *H01L 2224/16227* (2013.01); *H01L 2924/1427* (2013.01); *H01L 2924/19042* (2013.01); *H01L 2924/19103* (2013.01)

(58) Field of Classification Search
CPC ............... H01L 23/367; H01L 21/4853; H01L 21/1857
See application file for complete search history.

(56) References Cited

U.S. PATENT DOCUMENTS

| 9,515,003 B1* | 12/2016 | Fitzgerald ............... H01L 28/10 |
| 2014/0268615 A1* | 9/2014 | Yun .......................... H05K 3/10 |
| | | 361/782 |
| 2017/0064837 A1* | 3/2017 | Li ........................ H01L 21/4857 |
| 2018/0096777 A1* | 4/2018 | Akcasu .................... H01G 4/33 |
| 2020/0015348 A1* | 1/2020 | Hill ....................... H01L 21/486 |

* cited by examiner

*Primary Examiner* — Errol V Fernandes
(74) *Attorney, Agent, or Firm* — Essential Patents Group, LLP.

(57) ABSTRACT

An apparatus is provided which comprises: one or more pads comprising metal on a first substrate surface, the one or more pads to couple with contacts of an integrated circuit die, one or more substrate layers comprising dielectric material, one or more conductive contacts on a second substrate surface, opposite the first substrate surface, the one or more conductive contacts to couple with contacts of a printed circuit board, one or more inductors on the one or more substrate layers, the one or more inductors coupled with the one or more conductive contacts and the one or more pads, and highly thermally conductive material between the second substrate surface and a printed circuit board surface, the highly thermally conductive material contacting the one or more inductors. Other embodiments are also disclosed and claimed.

25 Claims, 8 Drawing Sheets

THERMALS FOR PACKAGES WITH INDUCTORS

BACKGROUND

As computing devices continue to get smaller and more powerful, integrated voltage regulators are being integrated into CPU, chipset, and other integrated circuit device packages. As new silicon processes have allowed for area scaling, the area for voltage regulator inductors has decreased while the current they must support has increased, resulting in higher power dissipation in a smaller area. As a result, the inductors in recent products heat up significantly more than the inductors in older products. Reliability considerations require the temperature of the inductors to be maintained below a specified value. In some cases, the maximum current supported by the product is limited by the maximum current the inductors can support before reaching their maximum temperature.

The resistance of the metal of an inductor can be high enough that when very large currents pass through the inductor, as is the case when the processor is operating in a high-power mode, the metal can heat up significantly. These inductors are positioned very close to the die, which is maintained at or below $T_j(max)$, the maximum safe operating temperature, typically around 110° C. The metal turns of the inductor can have 5 m$\Omega$ or more resistance, and in some operating conditions each inductor can be required to handle 5 A or more current. This results in the dissipation of 250 mW of power in a volume that is only a small fraction of a square millimeter. This heat causes the temperature of the routing that composes the turns of the inductor to rise significantly above the temperature in the die, in some cases by 50° C. or more. In many cases this causes the temperature to rise above the maximum limits allowed by the package for reliability reasons. Conventionally, the solution for preventing the inductors from heating the package past reliability limits has been to reduce the current supplied by the inductors, which would be accomplished by reducing the performance of the part (e.g. by lowering the clock frequency or inserting pause instructions).

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
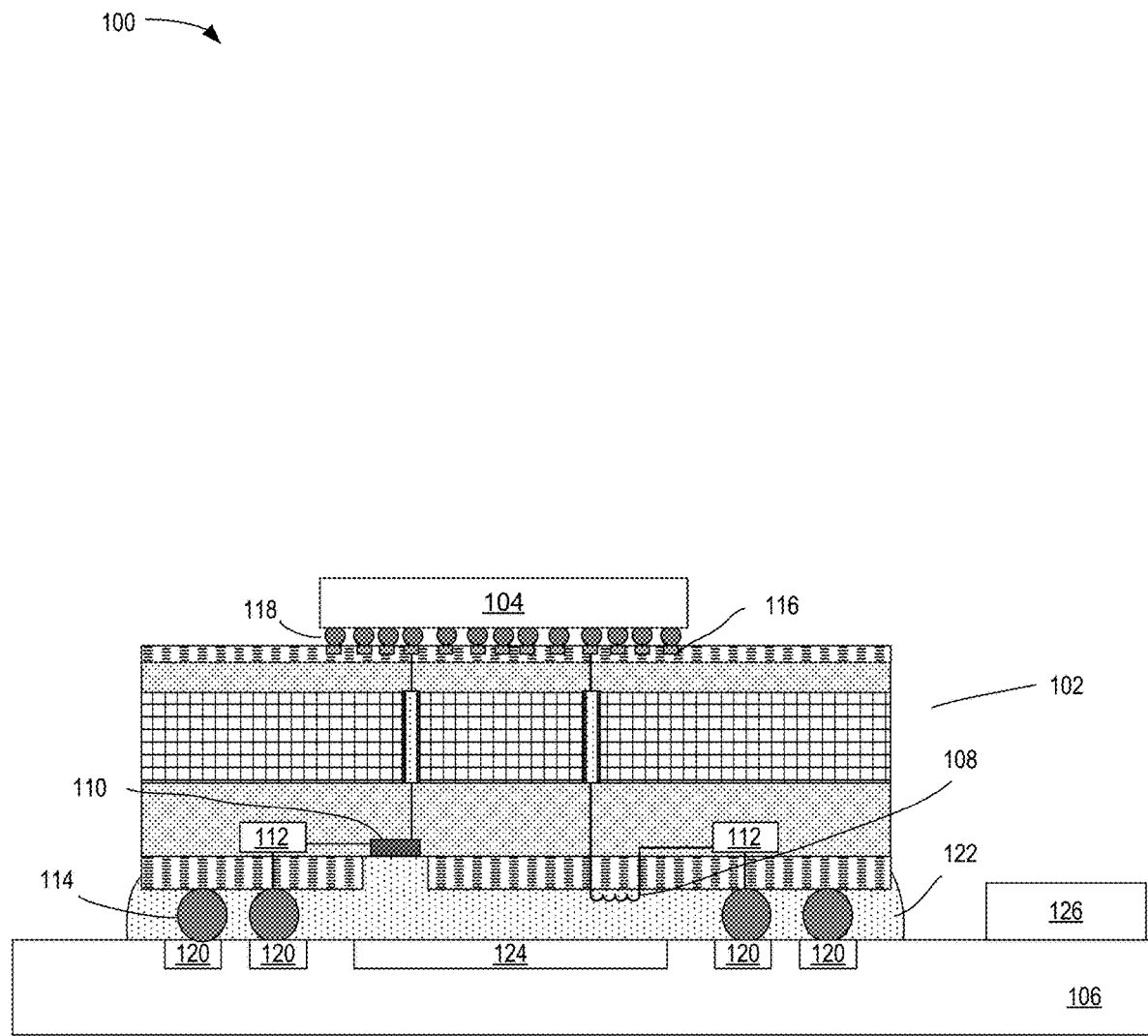
FIG. 1 illustrates a cross-sectional view of an example system with improved thermals for a package with inductors, according to some embodiments.

Improved thermals for packages with inductors is generally presented. In this regard, embodiments of the present disclosure enable heat from inductors on or in device packages to be transferred effectively. Thermally conductive material may be placed in contact with the inductors, between the device package and system board. One skilled in the art would appreciate that this approach may enable higher currents, and therefore power, to be delivered to integrated circuit devices, resulting in better performance and reliability.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

Unless otherwise specified the use of the ordinal adjectives "first," "second," and "third," etc., to describe a common object, merely indicates that different instances of like objects are being referred to, and is not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C). The terms "left," "right," "front," "back,"

"top," "bottom," "over," "under," and the like in the description and in the claims, if any, are used for descriptive purposes and not necessarily for describing permanent relative positions.

FIG. 1 illustrates a cross-sectional view of an example system with improved thermals for a package with inductors, according to some embodiments. As shown, system 100 includes package substrate 102, integrated circuit die 104, system board 106, mounted inductor 108, embedded inductor 110, voltage regulator circuits 112, package contacts 114, package pads 116, device contacts 118, system board pads 120, conductive underfill 122, thermal pad 124, and component 126. In some embodiments, system 100 may represent a computing or communication device. System 100 may be part of any type of system, including, but not limited to, a personal computing, mobile, desktop, laptop, or server system.

In some embodiments, package substrate 102 may include one or more of mounted inductors 108 and/or embedded inductors 110. As shown in more detail hereinafter, mounted inductors 108 may be discrete inductors which are mounted to, and extend beyond, a lower surface of package substrate 102, while embedded inductors 110 may include coils embedded in a layer of dielectric material of package substrate 102.

In some embodiments, mounted inductors 108 may be copper traces wrapped around magnetic material. In some embodiments, mounted inductors 108 may include an inductor array as described in U.S. Pat. No. 9,911,723, entitled "Magnetic small footprint inductor array module for on-package voltage regulator." While shown as being completely below package substrate 102, in some embodiments, mounted inductors 108 may be mounted in a recess within package substrate 102 and may be partially surrounded by portions of package substrate 102.

In some embodiments, embedded inductors 110 may be patterned routing formed on a layer within package substrate 102. In some embodiments, metal routing layers having a thickness of between 10 and 20 micrometers are patterned in loops between dielectric layers to form embedded inductors 100.

In some embodiments, voltage regulator circuits 112 may represent components of a fully integrated voltage regulator, and may include, for example, switches, logic, capacitors, a compensator circuit, or other switching voltage regulator components. Mounted inductors 108 and embedded inductors 110 may be part of a circuit path from package contacts 114, through voltage regulator circuits 112, to package pads 116. In some embodiments, voltage regulator circuits 112 may be integrated within integrated circuit die 104 and may not be present in package substrate 102. In other embodiments, voltage regulator circuits 112 may be included in a separate device, possibly mounted to package substrate 102.

Package contacts 114 may represent solder balls, such as, for example a ball grid array (BGA) arrangement. In some embodiments, package contacts 114 extend further below package substrate 102 than mounted inductors 108. Package pads 116 may represent conductive contacts, such as solder pads, microbumps, etc. to route input/output signals, power, ground, etc. to and from integrated circuit die 104.

In some embodiments, conductive underfill 122 represents a thermally conductive, but electrically insulative, material that has been deposited between package substrate 102 and system board 106, to conduct and spread heat away from mounted inductors 108 and embedded inductors 110. In some embodiments, conductive underfill 122 may extend outside of, and surround, package contacts 114. In some embodiments, conductive underfill 122 is thermally conductive alumina filled epoxy underfill, though other underfill materials may be used. In some embodiments, conductive underfill 122 has a thermal conductivity of greater than 0.5 watts per meter-kelvin (W/(mK)). In some embodiments, conductive underfill 122 has a thermal conductivity of greater than 1 watt per meter-kelvin (W/(mK)).

System board 106 may be a printed circuit board of any number of layers. In some embodiments, system board 106 includes a thermal region 124, which may be an embedded plane of metal or other thermally conductive material that is coupled with conductive underfill 122. In some embodiments, thermal region 124 may be known to one skilled in the art as a coin or a slug. In other embodiments, board thermal region 124 may represent an external thermal solution coupled with system board 106, such as, for example, a metal plate placed on the surface of system board 106. In some embodiments, thermal region 124 is a solid piece of copper that spans laterally (in x and y dimensions) beyond mounted inductors 108 and embedded inductors 110. In some embodiments, thermal region 124 extends above and below a surface of system board 106. In some embodiments, thermal region 124 extends fully through the height of system board 106.

Package substrate 304 may couple with system board 106 through any known method including, but not limited to soldering. In some embodiments, each package contact 114 is coupled with a system board pad 120. System board 106 may include one or more components 126, including, but not limited to, processors, controllers, sensors, memory devices, passive devices, etc, which may be coupled with die 104 through electrical routing (not shown).

Figure 2:
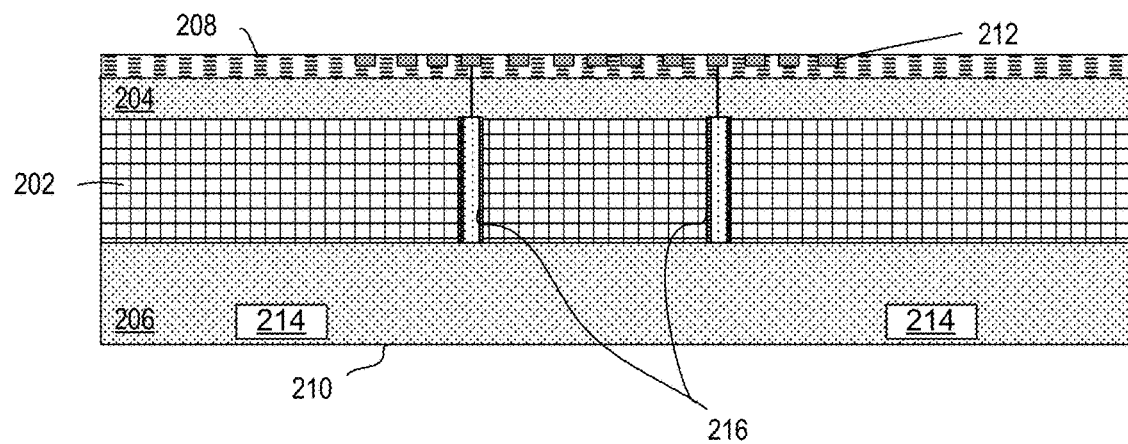
FIG. 2 illustrates a cross-sectional view of a partially formed package, according to some embodiments.

FIG. 2 illustrates a cross-sectional view of a partially formed package, according to some embodiments. As shown, substrate 200 includes substrate core 202, upper build-up layers 204, lower build-up layers 206, upper substrate surface 208, lower substrate surface 210, metal pads 212, voltage regulator circuitry 214, and vias 216. In other embodiments, substrate 200 may include more or fewer layers than shown. For example, in some embodiments, substrate core 202 or lower build-up layers 206 may not be present.

Substrate 200 may include a substrate core 202 for mechanical stability. In some embodiments, substrate core 202 may be a woven fiber cloth, such as fiberglass, that has been impregnated with epoxy and subsequently cured to provide mechanical stiffness. In other embodiments, other materials such as glass or metal may be utilized as a substrate core 202, or, alternatively, substrate 200 may not include a substrate core 202.

In some embodiments, substrate 200 includes upper build-up layers 204 and lower build-up layers 206, on opposite sides of substrate core 202, which may include an organic or inorganic dielectric material, which may include silicon dioxide or other inorganic or organic dielectrics (such as a polymer). Upper build-up layers 204 and lower build-up layers 206 may be built up iteratively with metal routing (not shown) to conductively couple metal pads 212 on upper substrate surface 208 with voltage regulator circuitry 214 and other traces leading to lower substrate surface 210.

Metal pads 212 may be formed on upper substrate surface 208, for example within a solder resist layer, to couple with an integrated circuit device. Voltage regulator circuitry 214 may include active and/or passive components that are formed or placed in lower build-up layers 206 (and/or upper build-up layers 204). In some embodiments, vias 216 may be plated holes that have been drilled through substrate core 202.

Figure 3:
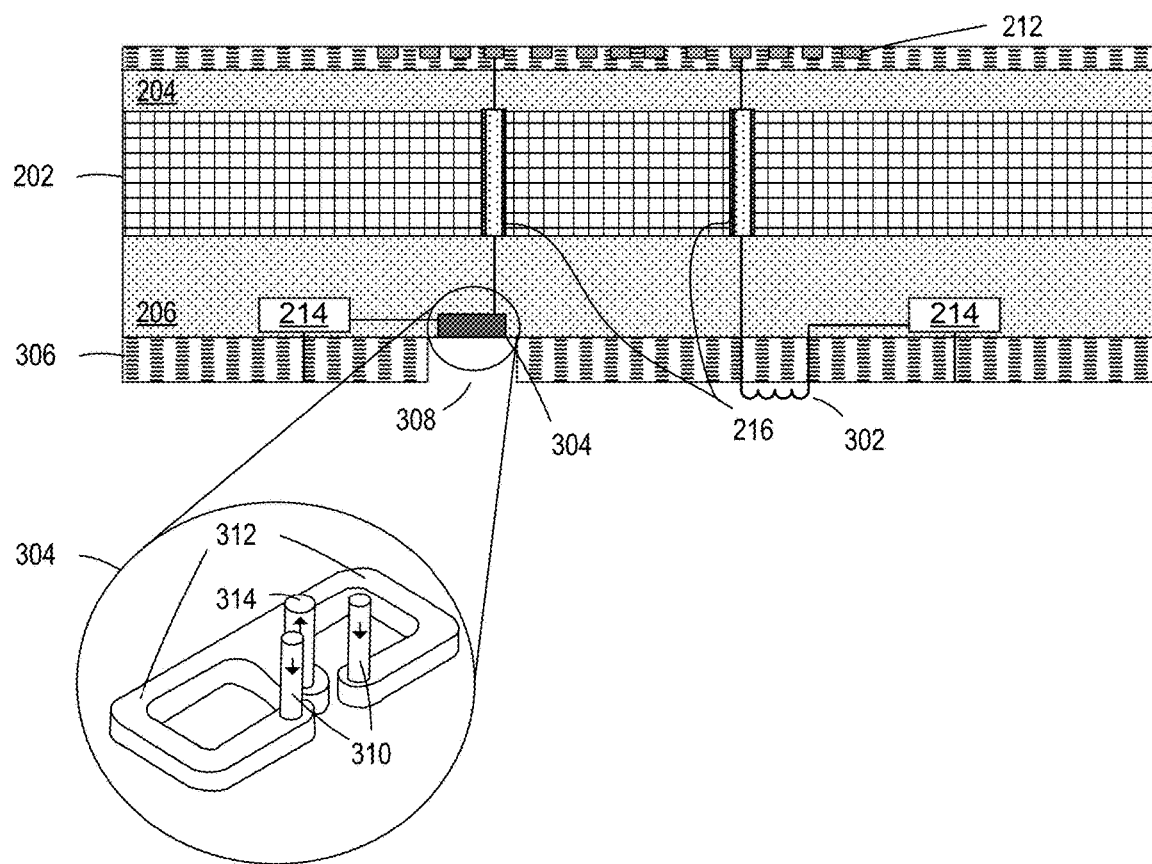
FIG. 3 illustrates a cross-sectional view of a partially formed package with inductors, according to some embodiments.

FIG. 3 illustrates a cross-sectional view of a partially formed package with inductors, according to some embodiments. As shown, substrate 300 includes mounted inductor 302, embedded inductor 304, solder resist layer 306, and void 308. While shown as including both mounted inductor 302 and embedded inductor 304, in some embodiments, substrate 300 may include only one type of inductor.

Mounted inductor 302 may include coils wrapped around a magnetic core (not shown) and may represent an array of surface mount inductors or discrete surface mount technology inductors. In some embodiments, mounted inductor 302 may include coils oriented perpendicular to lower substrate surface 210. While shown as being coupled with solder resist layer 306, in some embodiments mounted inductor 302 is coupled with lower build-up layers 206.

In some embodiments, embedded inductor 304 may be formed by any patterned metal plating technique within lower build-up layers 206 and may include input vias 310, coils 312, and output via 314. While shown as being separated from substrate core 202, in some embodiments, embedded inductor 304 may be formed on a surface of substrate core 202. In some embodiments, input vias 310 and output via 314 are composed of, or linearly coupled with vias 216. While shown as having racetrack-style coils 312, other coil configurations may be utilized. In some embodiments, embedded inductor 304 may have an air core, while in other embodiments, embedded inductor 304 may have a magnetic core. In some embodiments, coils 312 may be parallel to lower substrate surface 210. In some embodiments, mounted inductor 302 or embedded inductor 304 have an internal resistance of greater than 5 milliohms.

In some embodiments, solder resist layer 306 may be formed over lower substrate surface 210. In some embodiments, void 308 is formed in solder resist layer 306 to expose embedded inductor 304. While shown as being formed in solder resist layer 306, void 308 may extend through multiple or different material layers, such as lower build-up layers 206, for example, as needed to expose embedded inductor 304.

Figure 4:
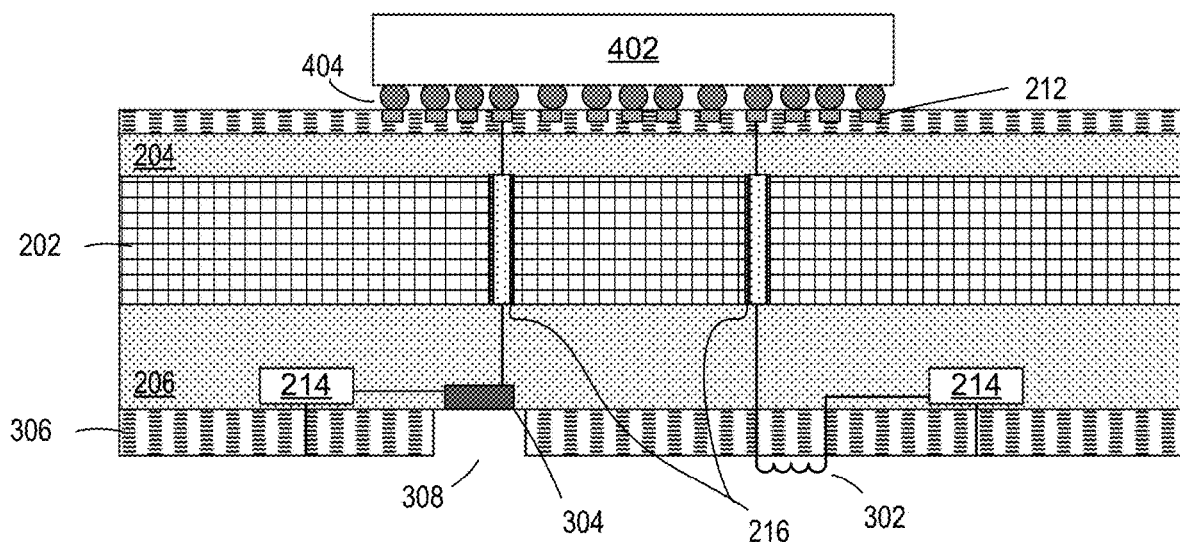
FIG. 4 illustrates a cross-sectional view of a partially formed package with inductors, according to some embodiments.

FIG. 4 illustrates a cross-sectional view of a partially formed package with inductors, according to some embodiments. As shown, package 400 includes die 402 and die contacts 404. In some embodiments, die 402 may couple with substrate 300 through any known method including, but not limited to soldering. In some embodiments, each die contact 404 is coupled with a metal pad 212. Die 402 may represent any type of integrated circuit device, including, but not limited to, a processor, controller, programmable chip, system on a chip, etc.

Figure 5:
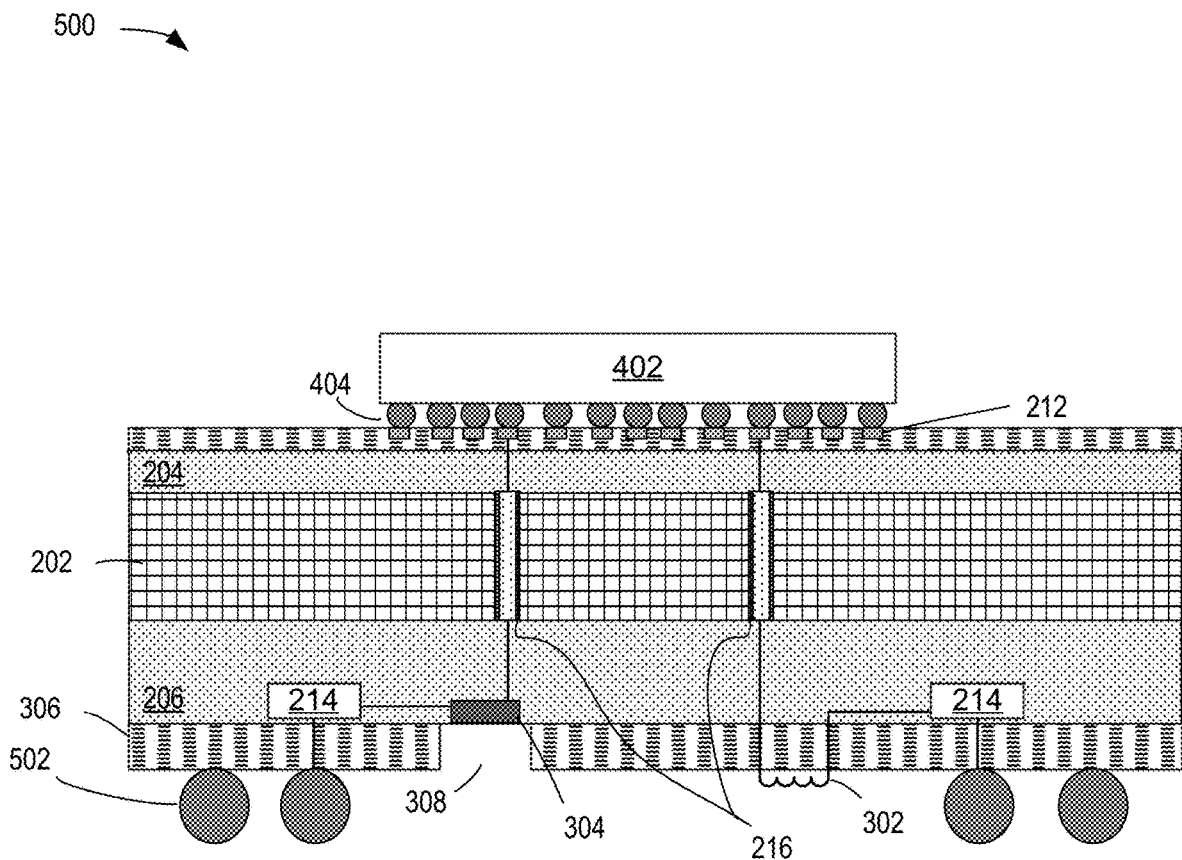
FIG. 5 illustrates a cross-sectional view of a package with inductors, according to some embodiments.

FIG. 5 illustrates a cross-sectional view of a package with inductors, according to some embodiments. As shown, package 500 includes package contacts 502. In some embodiments, contacts 502 may represent solder balls, such as in a ball grid array (BGA), however in other embodiments, pins or other known contacts may be used. To the extent mounted inductor 302 is present, package contacts 502 should extend further away from solder resist layer 306 than mounted inductor 302 to serve as a stand-off and provide clearance when package 500 is attached to a planar system board.

Figure 6:
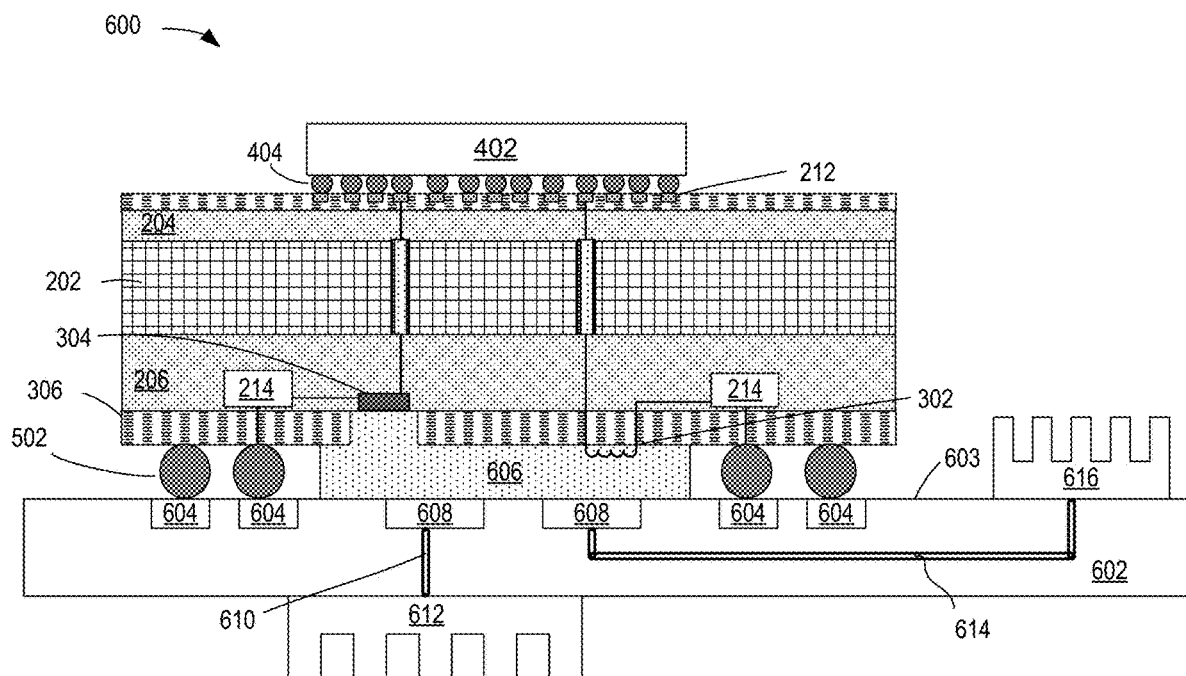
FIG. 6 illustrates a cross-sectional view of a system with improved thermals for a package with inductors, according to some embodiments.

FIG. 6 illustrates a cross-sectional view of a system with improved thermals for a package with inductors, according to some embodiments. As shown, system 600 includes system board 602, board pads 604, thermal interface material 606, thermal contacts 608, thermal via 610, heatsink 612, thermal via 614, and heatsink 616. Package 500 may couple with system board 602 through any known method including, but not limited to soldering. In some embodiments, each package contact 502 is coupled with a board pad 604. System board 602 may include one or more additional components (not shown).

In some embodiments, thermal interface material 606 is placed in contact with system board 602 before package 500 and forms a thermal interface to spread and diffuse heat generated by mounted inductor 302 and embedded inductor 304. In some embodiments, thermal interface material 606 is a semi-solid material, such as a paste or grease, that can deform to fill voids, such as void 308, when a force is exerted upon it. For example, thermal interface material 606 may initially have a height greater than the space between package 500 and system board 602, and the downward force of mounting package 500 on system board 602 may cause thermal interface material 606 to compress in height and expand in width. In some embodiments, thermal interface material 606 is centrally located inside of package contacts 502. In some embodiments, thermal interface material 606 is a highly thermally conductive material having a thermal conductivity of greater than 4 watts per meter-kelvin (W/(mK)).

System board 602 may include one or more thermal contacts 608, which may be copper or another metal, embedded on or in a surface to further spread heat away from mounted inductor 302 and embedded inductor 304. In some embodiments, heatsink 612 is included in system 600 to further spread heat from mounted inductor 302 and embedded inductor 304 to an opposite side of system board 602 from package 500. In some embodiments, heatsink 616 is included in system 600 to further spread heat from mounted inductor 302 and embedded inductor 304 on a same side of system board 602 as package 500. Heatsink 612 and heatsink 616 may be thermally coupled with thermal interface material 606 through thermal via 610 and thermal via 614, respectively. While shown as being a single via, thermal via 610 and/or thermal via 614 may be an array of vias, such as metal traces larger than normal electrical vias or a range of other known thermal structures used in printed circuit boards, to conduct heat.

Figure 7:
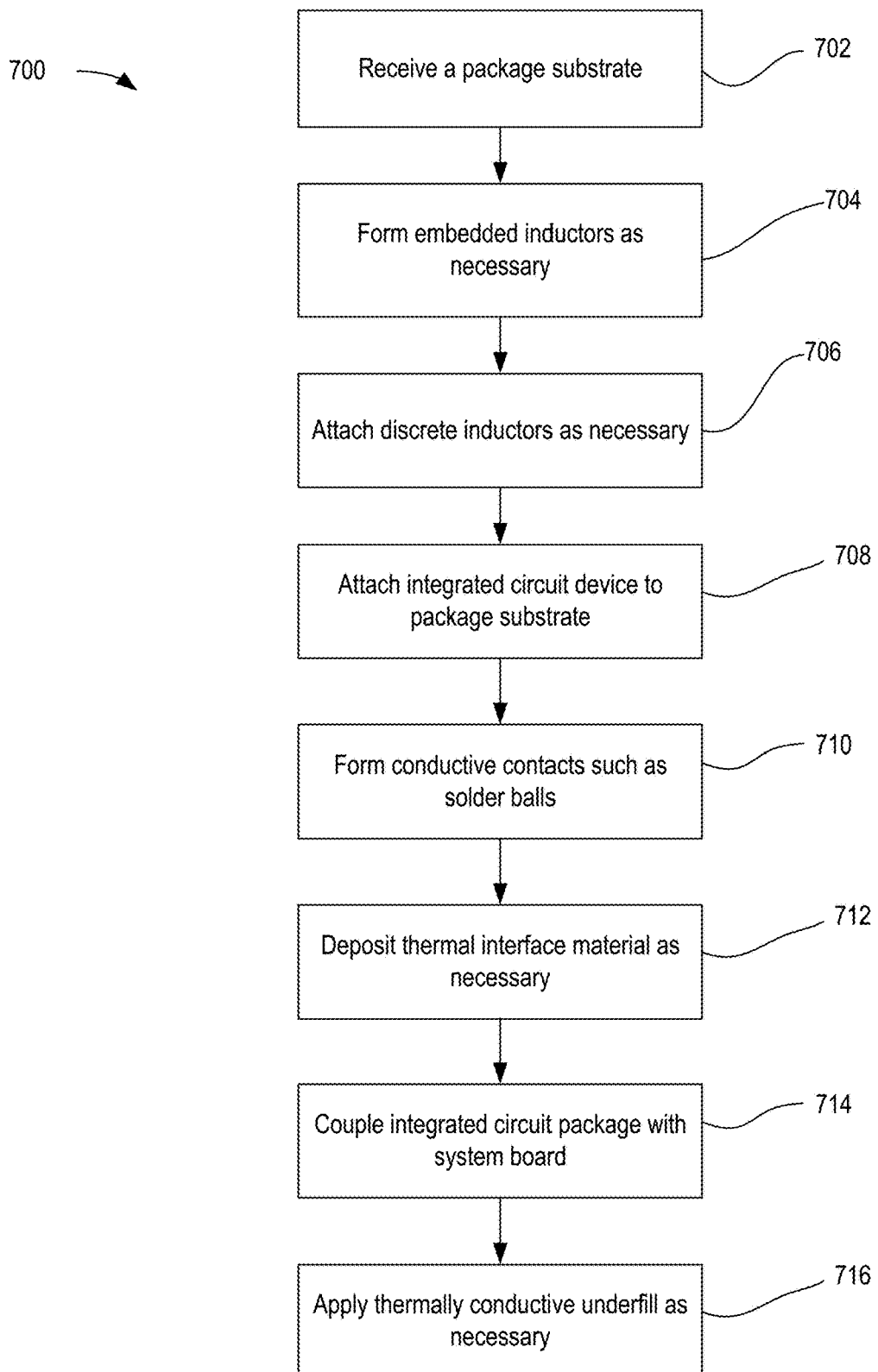
FIG. 7 illustrates a flowchart of a method of forming an assembly with improved thermals for a package with inductors, in accordance with some embodiments.

FIG. 7 illustrates a flowchart of a method of forming an assembly with improved thermals for a package with inductors, in accordance with some embodiments. Although the blocks in the flowchart with reference to FIG. 7 are shown in a particular order, the order of the actions can be modified. Thus, the illustrated embodiments can be performed in a different order, and some actions/blocks may be performed in parallel. Some of the blocks and/or operations listed in FIG. 7 are optional in accordance with certain embodiments. The numbering of the blocks presented is for the sake of clarity and is not intended to prescribe an order of operations in which the various blocks must occur. Additionally, operations from the various flows may be utilized in a variety of combinations.

Method 700 begins with receiving (702) a package substrate. In some embodiments, package substrate 202 may include a substrate core 202 with vias 216 routed though the core. In some embodiments, package substrate 202 may include upper and/or lower build-up layers, such as upper build-up layers 204 and lower build-up layers 206. Next, embedded inductors may be formed (704) in the package substrate. In some embodiments, embedded inductor 304 may be formed by patterned metal plating or other techniques to form coils 312, which may resemble a racetrack configuration or some other configuration. In some embodiments, magnetic material may be included as a core material in embedded inductors 304, while in other embodiments embedded inductors 304 includes an air core.

Then, discrete inductors may be attached (706) to the package substrate. In some embodiments, mounted inductors 302 may be attached using surface mount technology discrete components and soldering techniques. In some embodiments, mounted inductors 302 include an array of inductors with magnetic cores. Next, an integrated circuit device is attached (708) to the package substrate. In some embodiments, die 402 may be mounted to a surface of the package substrate opposite the mounted and/or embedded inductors.

The method continues with forming (710) conductive contacts, such as solder balls, on the package substrate. In some embodiments, package contacts 502 are part of a ball grid array (BGA) and extend away from the surface of the package substrate beyond the mounted inductor 302. Next, thermal interface material may be deposited (712). In some embodiments, thermal interface material 606 may be applied to system board 602 as a semi-solid, such as a paste or grease. In some embodiments, thermal interface material 606 may be applied to the package substrate over the inductors, before the package is mounted to a system board.

Then the integrated circuit device package is coupled (714) with the system board. In some embodiments, package 500 may be soldered to system board 602. Finally, thermally conductive underfill may be applied (716) between the integrated circuit device package and the system board. In some embodiments, conductive underfill 122 is applied as a liquid, such as an epoxy, and then cured.

Figure 8:
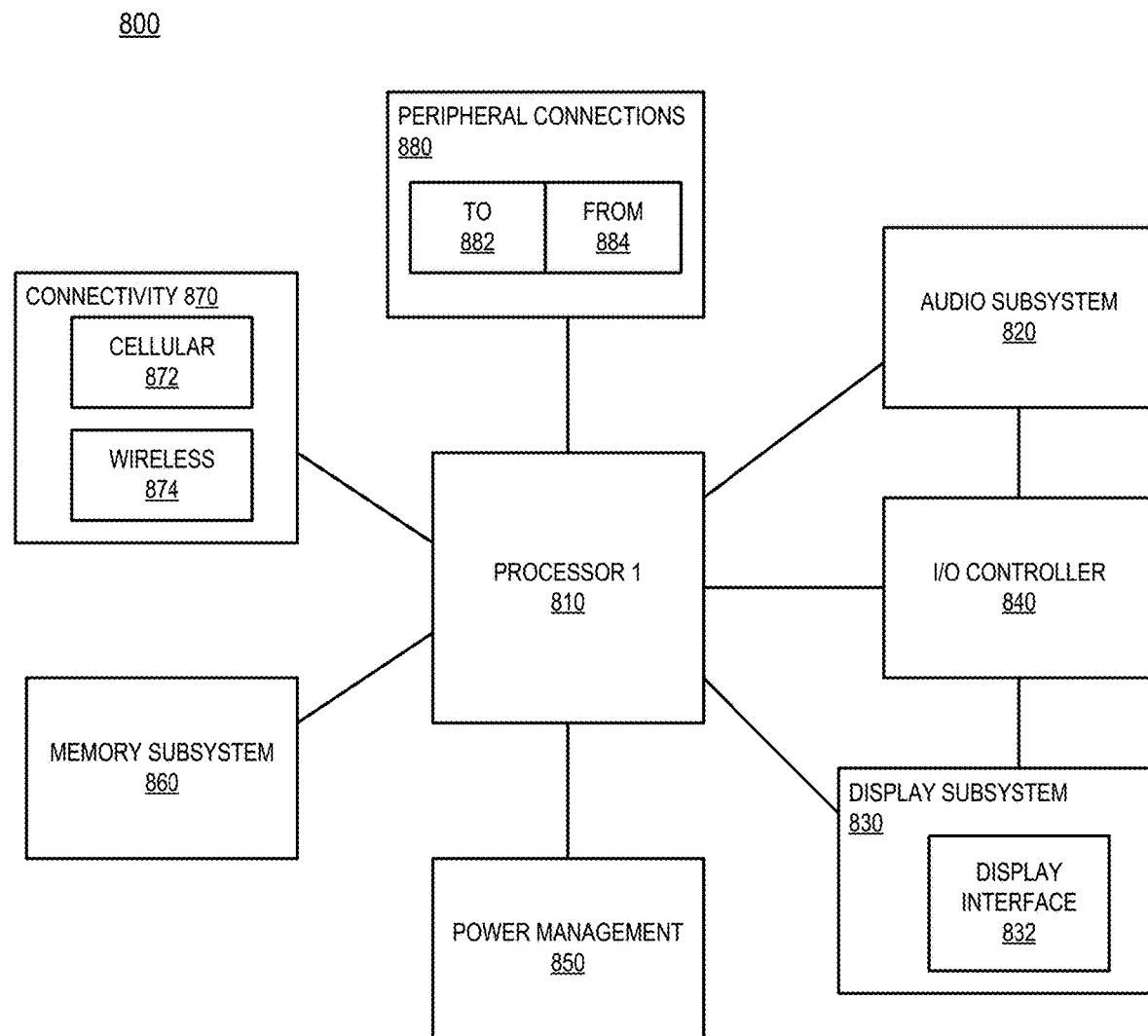
FIG. 8 illustrates a smart device or a computer system or a SoC (System-on-Chip) which includes an assembly with improved thermals for a package with inductors, according to some embodiments.

FIG. 8 illustrates a smart device or a computer system or a SoC (System-on-Chip) 800 which includes an assembly with improved thermals for packages with inductors, according to some embodiments. In some embodiments, computing device 800 represents a mobile computing device, such as a computing tablet, a mobile phone or smart-phone, a wireless-enabled e-reader, or other wireless mobile device. It will be understood that certain components are shown generally, and not all components of such a device are shown in computing device 800. In some embodiments, one or more components of computing device 800, for example processor 810 and/or connectivity 870, include a package with improved thermals as described above.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bipolar junction transistors—BJT PNP/NPN, BiCMOS, CMOS, etc., may be used without departing from the scope of the disclosure.

In some embodiments, computing device 800 includes a first processor 810. The various embodiments of the present disclosure may also comprise a network interface within 870 such as a wireless interface so that a system embodiment may be incorporated into a wireless device, for example, cell phone or personal digital assistant.

In one embodiment, processor 810 can include one or more physical devices, such as microprocessors, application processors, microcontrollers, programmable logic devices, or other processing means. The processing operations performed by processor 810 include the execution of an operating platform or operating system on which applications and/or device functions are executed. The processing operations include operations related to I/O (input/output) with a human user or with other devices, operations related to power management, and/or operations related to connecting the computing device 800 to another device. The processing operations may also include operations related to audio I/O and/or display I/O.

In one embodiment, computing device 800 includes audio subsystem 820, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 800, or connected to the computing device 800. In one embodiment, a user interacts with the computing device 800 by providing audio commands that are received and processed by processor 810.

Display subsystem 830 represents hardware (e.g., display devices) and software (e.g., drivers) components that provide a visual and/or tactile display for a user to interact with the computing device 800. Display subsystem 830 includes display interface 832, which includes the particular screen or hardware device used to provide a display to a user. In one embodiment, display interface 832 includes logic separate from processor 810 to perform at least some processing related to the display. In one embodiment, display subsystem 830 includes a touch screen (or touch pad) device that provides both output and input to a user.

I/O controller 840 represents hardware devices and software components related to interaction with a user. I/O controller 840 is operable to manage hardware that is part of audio subsystem 820 and/or display subsystem 830. Additionally, I/O controller 840 illustrates a connection point for additional devices that connect to computing device 800 through which a user might interact with the system. For example, devices that can be attached to the computing device 800 might include microphone devices, speaker or stereo systems, video systems or other display devices, keyboard or keypad devices, or other I/O devices for use with specific applications such as card readers or other devices.

As mentioned above, I/O controller 840 can interact with audio subsystem 820 and/or display subsystem 830. For example, input through a microphone or other audio device can provide input or commands for one or more applications or functions of the computing device 800. Additionally, audio output can be provided instead of, or in addition to display output. In another example, if display subsystem 830 includes a touch screen, the display device also acts as an input device, which can be at least partially managed by I/O controller 840. There can also be additional buttons or switches on the computing device 800 to provide I/O functions managed by I/O controller 840.

In one embodiment, I/O controller 840 manages devices such as accelerometers, cameras, light sensors or other environmental sensors, or other hardware that can be included in the computing device 800. The input can be part of direct user interaction, as well as providing environmental input to the system to influence its operations (such as filtering for noise, adjusting displays for brightness detection, applying a flash for a camera, or other features).

In one embodiment, computing device 800 includes power management 850 that manages battery power usage, charging of the battery, and features related to power saving operation. Memory subsystem 860 includes memory devices for storing information in computing device 800. Memory can include nonvolatile (state does not change if power to the memory device is interrupted) and/or volatile (state is indeterminate if power to the memory device is interrupted) memory devices. Memory subsystem 860 can store application data, user data, music, photos, documents, or other data, as well as system data (whether long-term or temporary) related to the execution of the applications and functions of the computing device 800.

Elements of embodiments are also provided as a machine-readable medium (e.g., memory 860) for storing the computer-executable instructions. The machine-readable medium (e.g., memory 860) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 870 includes hardware devices (e.g., wireless and/or wired connectors and communication hardware) and software components (e.g., drivers, protocol stacks) to enable the computing device 800 to communicate with external devices. The computing device 800 could be separate devices, such as other computing devices, wireless access points or base stations, as well as peripherals such as headsets, printers, or other devices.

Connectivity 870 can include multiple different types of connectivity. To generalize, the computing device 800 is illustrated with cellular connectivity 872 and wireless connectivity 874. Cellular connectivity 872 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 874 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 880 include hardware interfaces and connectors, as well as software components (e.g., drivers, protocol stacks) to make peripheral connections. It will be understood that the computing device 800 could both be a peripheral device ("to" 882) to other computing devices, as well as have peripheral devices ("from" 884) connected to it. The computing device 800 commonly has a "docking" connector to connect to other computing devices for purposes such as managing (e.g., downloading and/or uploading, changing, synchronizing) content on computing device 800. Additionally, a docking connector can allow computing device 800 to connect to certain peripherals that allow the computing device 800 to control content output, for example, to audiovisual or other systems.

In addition to a proprietary docking connector or other proprietary connection hardware, the computing device 800 can make peripheral connections 880 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

In one example, an apparatus is provided comprising: one or more pads comprising metal on a first substrate surface, the one or more pads to couple with contacts of an integrated circuit die; one or more substrate layers comprising dielectric material; one or more conductive contacts on a second substrate surface, opposite the first substrate surface, the one or more conductive contacts to couple with contacts of a printed circuit board; one or more inductors on the one or more substrate layers, the one or more inductors coupled with the one or more conductive contacts and the one or more pads; and highly thermally conductive material between the second substrate surface and a printed circuit board surface, the highly thermally conductive material contacting the one or more inductors.

In some embodiments, the one or more inductors are coupled with, and extend beyond, the second substrate surface. In some embodiments, the one or more inductors are embedded within the second substrate surface. In some embodiments, the one or more embedded inductors are exposed through the second substrate surface by one or more material layer voids. In some embodiments, the material layer voids comprise openings in a solder mask layer. In some embodiments, the conductive contacts comprise ball grid array (BGA) contacts. In some embodiments, the one or more inductors comprise a resistance of greater than 5 milliohms. In some embodiments, highly thermally conductive material comprises a cured underfill material.

In another example, an integrated circuit device package is provided comprising: an integrated circuit die; and a package substrate coupled with the integrated circuit die, wherein the package substrate comprises: one or more pads comprising metal on a first substrate surface, the one or more pads coupled with contacts of the integrated circuit die; one or more substrate layers comprising dielectric material; one or more conductive contacts on a second substrate surface, opposite the first substrate surface, the one or more conductive contacts to couple with contacts of a printed circuit board; one or more inductors on the one or more substrate layers, the one or more inductors coupled with the one or more conductive contacts and the one or more pads; and highly thermally conductive material between the second substrate surface and a printed circuit board surface, the highly thermally conductive material contacting the one or more inductors.

In some embodiments, the highly thermally conductive material comprises a semi-solid thermal interface material. In some embodiments, the semi-solid thermal interface material is limited to a location interior to the conductive contacts. In some embodiments, the highly thermally conductive material comprises a cured underfill material. In some embodiments, the cured underfill material extends through and beyond the conductive contacts. In some embodiments, the highly thermally conductive material comprises a thermal conductivity of greater than 0.5 watts per meter-kelvin (W/(mK)). In some embodiments, the one or more inductors are embedded within the second substrate surface, the embedded inductors exposed through the second substrate surface by one or more material layer voids. In some embodiments, the one or more inductors comprise at least one inductor embedded within the second substrate surface and at least one inductor surface-mounted to the second substrate surface.

In another example a system is provided comprising: a printed circuit board; one or more components coupled with the printed circuit board; and an integrated circuit device package coupled with the printed circuit board, wherein the integrated circuit device package comprises: an integrated circuit die; and a package substrate coupled with the integrated circuit die, wherein the package substrate comprises: one or more pads comprising metal on a first substrate surface, the one or more pads coupled with contacts of the integrated circuit die; one or more substrate layers comprising dielectric material; one or more conductive contacts on a second substrate surface, opposite the first substrate surface, the one or more conductive contacts coupled with contacts of the printed circuit board; one or more inductors on the one or more substrate layers, the one or more inductors coupled with the one or more conductive contacts and the one or more pads; and highly thermally conductive material between the second substrate surface and a surface of the printed circuit board, the highly thermally conductive material contacting the one or more inductors.

In some embodiments, the printed circuit board surface comprises one or more thermally conductive pads contacting the highly thermally conductive material. In some embodiments, the one or more thermally conductive pads are coupled with metal routing to a copper plane. In some embodiments, the one or more thermally conductive pads are coupled with metal routing to a heatsink, the heatsink comprising metal fins. In some embodiments, the heatsink is coupled with the printed circuit board surface. In some embodiments, the printed circuit board surface comprises a first printed circuit board surface and wherein the heatsink is coupled with a second printed circuit board surface opposite the first printed circuit board surface. In some embodiments, the one or more inductors are embedded within the second substrate surface, the embedded inductors exposed through the second substrate surface by one or more material layer voids. In some embodiments, the highly thermally conductive material comprises a thermal conductivity of greater than 1 watt per meter-kelvin (W/(mK)). In some embodiments, the highly thermally conductive material comprises a cured underfill material and wherein the cured underfill material extends through and beyond the conductive contacts.

In another example a method of forming a computing system is provided comprising: forming one or more inductors adjacent to a first substrate surface; attaching an integrated circuit device to conductive contacts on a second substrate surface; attaching conductive contacts on the first substrate surface to a system board; and forming thermally conductive material between the first substrate surface and the system board, the thermally conductive material contacting the one or more inductors.

In some embodiments, forming one or more inductors comprises depositing metal to form one or more curved formations. Some embodiments also include removing a portion of a material layer on the first substrate surface to expose the one or more inductors. In some embodiments, forming one or more inductors comprises attaching one or more discrete inductors. In some embodiments, forming thermally conductive material comprises flowing an underfill between the first substrate surface and the system board. In some embodiments, forming thermally conductive material comprises placing a semi-solid thermal interface material in contact with the system board. Some embodiments also include attaching one or more heatsinks to the system board along a thermal vias coupled with the thermally conductive material.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

I claim:

1. An apparatus comprising:
   one or more pads comprising metal on a first substrate surface, the one or more pads to couple with contacts of an integrated circuit die;
   one or more substrate layers comprising dielectric material;
   one or more conductive contacts on a second substrate surface, opposite the first substrate surface, the one or more conductive contacts to couple with contacts of a printed circuit board;
   one or more inductors on the one or more substrate layers, the one or more inductors coupled with the one or more conductive contacts and the one or more pads; and
   highly thermally conductive material between the second substrate surface and a printed circuit board surface, the highly thermally conductive material contacting the one or more inductors.

2. The apparatus of claim 1, wherein the one or more inductors are coupled with, and extend beyond, the second substrate surface.

3. The apparatus of claim 1, wherein the one or more inductors are embedded within the second substrate surface.

4. The apparatus of claim 3, wherein the one or more embedded inductors are exposed through the second substrate surface by one or more material layer voids.

5. The apparatus of claim 4, wherein the material layer voids comprise openings in a solder mask layer.

6. The apparatus of claim 1, wherein the conductive contacts comprise ball grid array (BGA) contacts.

7. The apparatus of claim 1, wherein the one or more inductors comprise a resistance of greater than 5 milliohms.

8. The apparatus of claim 1, wherein highly thermally conductive material comprises a cured underfill material.

9. An integrated circuit device package comprising:
   an integrated circuit die; and
   a package substrate coupled with the integrated circuit die, wherein the package substrate comprises:
      one or more pads comprising metal on a first substrate surface, the one or more pads coupled with contacts of the integrated circuit die;
      one or more substrate layers comprising dielectric material;
      one or more conductive contacts on a second substrate surface, opposite the first substrate surface, the one or more conductive contacts to couple with contacts of a printed circuit board;
      one or more inductors on the one or more substrate layers, the one or more inductors coupled with the one or more conductive contacts and the one or more pads; and
      highly thermally conductive material between the second substrate surface and a printed circuit board surface, the highly thermally conductive material contacting the one or more inductors.

10. The integrated circuit device package of claim 9, wherein the highly thermally conductive material comprises a semi-solid thermal interface material.

11. The integrated circuit device package of claim 10, wherein the semi-solid thermal interface material is limited to a location interior to the conductive contacts.

12. The integrated circuit device package of claim 9, wherein the highly thermally conductive material comprises a cured underfill material.

13. The integrated circuit device package of claim 12, wherein the cured underfill material extends through and beyond the conductive contacts.

14. The integrated circuit device package of claim 9, wherein the highly thermally conductive material comprises a thermal conductivity of greater than 0.5 watts per meter-kelvin (W/(mK)).

15. The integrated circuit device package of claim 9, wherein the one or more inductors are embedded within the second substrate surface, the embedded inductors exposed through the second substrate surface by one or more material layer voids.

16. The integrated circuit device package of claim 9, wherein the one or more inductors comprise at least one inductor embedded within the second substrate surface and at least one inductor surface-mounted to the second substrate surface.

17. A system comprising:
   a printed circuit board;
   one or more components coupled with the printed circuit board; and
   an integrated circuit device package coupled with the printed circuit board, wherein the integrated circuit device package comprises:
      an integrated circuit die; and
      a package substrate coupled with the integrated circuit die, wherein the package substrate comprises:
         one or more pads comprising metal on a first substrate surface, the one or more pads coupled with contacts of the integrated circuit die;
         one or more substrate layers comprising dielectric material;
         one or more conductive contacts on a second substrate surface, opposite the first substrate surface, the one or more conductive contacts coupled with contacts of the printed circuit board;
         one or more inductors on the one or more substrate layers, the one or more inductors coupled with the one or more conductive contacts and the one or more pads; and
         highly thermally conductive material between the second substrate surface and a surface of the printed circuit board, the highly thermally conductive material contacting the one or more inductors.

18. The system of claim 17, wherein the printed circuit board surface comprises one or more thermally conductive pads contacting the highly thermally conductive material.

19. The system of claim 18, wherein the one or more thermally conductive pads are coupled with metal routing to a copper plane.

20. The system of claim 18, wherein the one or more thermally conductive pads are coupled with metal routing to a heatsink, the heatsink comprising metal fins.

21. The system of claim 20, wherein the heatsink is coupled with the printed circuit board surface.

22. The system of claim 20, wherein the printed circuit board surface comprises a first printed circuit board surface and wherein the heatsink is coupled with a second printed circuit board surface opposite the first printed circuit board surface.

23. The system of claim 17, wherein the one or more inductors are embedded within the second substrate surface, the embedded inductors exposed through the second substrate surface by one or more material layer voids.

24. The system of claim 17, wherein the highly thermally conductive material comprises a thermal conductivity of greater than 1 watt per meter-kelvin (W/(mK)).

25. The system of claim 17, wherein the highly thermally conductive material comprises a cured underfill material and wherein the cured underfill material extends through and beyond the conductive contacts.

* * * * *